(12) United States Patent
Lau et al.

(10) Patent No.: US 9,548,252 B2
(45) Date of Patent: Jan. 17, 2017

(54) REWORKABLE EPOXY RESIN AND CURATIVE BLEND FOR LOW THERMAL EXPANSION APPLICATIONS

(71) Applicant: RAYTHEON COMPANY, Waltham, MA (US)

(72) Inventors: Steven E. Lau, Harbor City, CA (US); Steffanie S. Ung, Monterey Park, CA (US)

(73) Assignee: RAYTHEON COMPANY, Waltham, MA (US)

( * ) Notice: Subject to any disclaimer, the term of this patent is extended or adjusted under 35 U.S.C. 154(b) by 235 days.

(21) Appl. No.: 14/084,564

(22) Filed: Nov. 19, 2013

(65) Prior Publication Data

US 2015/0137362 A1    May 21, 2015

(51) Int. Cl.

| | |
|---|---|
| H01L 23/29 | (2006.01) |
| H01L 23/31 | (2006.01) |
| H01L 23/48 | (2006.01) |
| C08L 63/00 | (2006.01) |
| C08G 59/50 | (2006.01) |
| C08K 3/34 | (2006.01) |
| C08K 3/36 | (2006.01) |
| C08K 3/38 | (2006.01) |
| C08K 3/40 | (2006.01) |
| C08K 7/26 | (2006.01) |
| C08K 7/28 | (2006.01) |
| C08K 3/22 | (2006.01) |
| C08K 7/16 | (2006.01) |
| C08K 7/20 | (2006.01) |
| C09J 163/00 | (2006.01) |
| H01L 21/56 | (2006.01) |
| H01L 23/00 | (2006.01) |

(52) U.S. Cl.
CPC ......... *H01L 23/293* (2013.01); *C08G 59/5033* (2013.01); *C08K 3/22* (2013.01); *C08K 3/40* (2013.01); *C08K 7/16* (2013.01); *C08K 7/20* (2013.01); *C09J 163/00* (2013.01); *H01L 21/563* (2013.01); *H01L 23/3142* (2013.01); *H01L 24/29* (2013.01); *H01L 24/83* (2013.01); *C08K 2003/2227* (2013.01); *H01L 24/13* (2013.01); *H01L 24/16* (2013.01); *H01L 24/32* (2013.01); *H01L 24/73* (2013.01); *H01L 24/92* (2013.01); *H01L 2224/131* (2013.01); *H01L 2224/16227* (2013.01); *H01L 2224/2929* (2013.01); *H01L 2224/29298* (2013.01); *H01L 2224/32225* (2013.01); *H01L 2224/73204* (2013.01); *H01L 2224/92125* (2013.01); *H01L 2924/15311* (2013.01)

(58) Field of Classification Search
USPC ........ 257/788, 789, 793, 794, 795; 428/414; 523/427, 428, 440, 442, 443, 444, 458, 466
See application file for complete search history.

(56) References Cited

U.S. PATENT DOCUMENTS

| | | |
|---|---|---|
| 4,528,305 A | 7/1985 | Henry |
| 5,095,047 A | 3/1992 | Ogitani et al. |
| 6,467,676 B1 | 10/2002 | Wang |
| 6,916,890 B1 | 7/2005 | Woods et al. |
| 6,936,664 B2 | 8/2005 | Woods et al. |
| 7,108,920 B1 | 9/2006 | Crane et al. |
| 7,482,201 B2 | 1/2009 | Charles et al. |
| 9,039,951 B2 * | 5/2015 | Meegan ................. C08G 59/38 264/241 |
| 9,249,282 B2 * | 2/2016 | Meegan ................. C08G 59/38 |
| 2002/0013420 A1 | 1/2002 | Wang et al. |
| 2008/0051524 A1 * | 2/2008 | Ji ............................ C08L 63/00 525/476 |
| 2009/0018239 A1 | 1/2009 | Woods et al. |
| 2010/0001415 A1 | 1/2010 | Asano et al. |
| 2010/0014263 A1 | 1/2010 | Tsuchida et al. |
| 2013/0225788 A1 | 8/2013 | Meegan |
| 2015/0218345 A1 * | 8/2015 | Meegan ................. C08G 59/38 264/257 |

FOREIGN PATENT DOCUMENTS

| | | | |
|---|---|---|---|
| EP | 0 395 250 A2 | 10/1990 | |
| EP | 1 479 706 A1 | 11/2004 | |
| JP | 04-018445 A | * 1/1992 | ............. C08L 63/00 |
| TW | 201343708 A | 11/2013 | |

OTHER PUBLICATIONS

Abstract of JP 04-018445 A (no date).*
Huntsman Advanced Materials: High Performance Components (2010).*
Written Opinion of the International Searching Authority for International Application No. PCT/US2014/054920, filed Sep. 10, 2014, Written Opinion of the International Searching Authority mailed Jan. 16, 2015 (5 pgs.).
International Search Report for International Application No. PCT/US2014/054920, filed Sep. 10, 2014, International Search Report dated Jan. 9, 2015 and mailed Jan. 16, 2015 (4 pgs.).
Taiwan Office Action issued in corresponding Taiwan Patent Application No. 10-3133032, filed Sep. 24, 2014, published Jun. 1, 2015, Publication No. 2015-20264. Office action mailed Jul. 24, 2015, with English translation of Search Report (9 pgs.).

* cited by examiner

*Primary Examiner* — Michael J Feely
(74) *Attorney, Agent, or Firm* — Lewis Roca Rothgerber Christie LLP

(57) ABSTRACT

A curable composition including: an epoxy resin; and an amine curing component including: an aromatic amine curing agent; and a solubilizer including an aliphatic amine, a cycloaliphatic amine, a non-volatile primary alcohol, non-volatile solvent or a mixture thereof. An electronic assembly including: a substrate; an underfill including a cured product of the curable composition on the substrate; and a ball grid array on the underfill is also disclosed.

19 Claims, 3 Drawing Sheets

FIG. 3

| Factors | Potlife | CTE | Viscosity | Cure Time | Cure Temp | Reworkability | Thermal Conductivity |
|---|---|---|---|---|---|---|---|
| Epoxy Resin | | | | | | | |
| Viscosity | No Effect | No Effect | ⬅ Increase / ➡ Decrease | No Effect | No Effect | No Effect | No Effect |
| Molecular Weight | ⬅ Higher MW / ➡ Lower MW | No Effect | ⬅ Higher MW / ➡ Lower MW | ➡ Higher MW / ➡ Lower MW | ➡ Higher MW / ➡ Lower MW | No Effect | No Effect |
| Equivalent Weight | ⬅ Higher EW / ➡ Lower EW | Unknown | ⬅ Higher EW / ➡ Lower EW | ➡ Higher EW / ➡ Lower EW | ➡ Higher EW / ➡ Lower EW | Unknown | No Effect |
| Curing Agent | | | | | | | |
| Anhydride | ⬅ >24 hours | ➡ | ➡ | ⬅ | ⬅ | ➡ | No Effect |
| Imidazole | ⬅ >24 hours | Unknown | Neutral | Moderate | ⬅ | Unknown | No Effect |
| Latent (powder) | ⬅ >24 hours | Unknown | ⬅ | ➡ | | Unknown | No Effect |
| Cycloaliphatic Amine | ➡ 2-8 hours | Unknown | ➡ | ➡ | ➡ | ⬅ | No Effect |
| Aromatic Amine | ⬅ 4-8 hours | ➡ | ➡ | ➡ | ➡ | Unknown | No Effect |
| Fillers | | | | | | | |
| Alumina (generally spherical) | No Effect | ➡ | ⬅ | No Effect | No Effect | Unknown | ⬅ |
| Glass (generally spherical) | No Effect | ➡ | ⬅ | No Effect | No Effect | Unknown | No Effect |
| $T_g$ | Not Applicable | Effect Varies | Not Applicable | Not Applicable | Not Applicable | ⬅ Lower Tg / ➡ Higher Tg | Not Applicable |

⬅ Increases -> potentially undesirable    ➡ Decreases -> potentially undesirable    ⬅ Increases -> potentially desirable    ➡ Decreases -> potentially desirable    ➡ Decreases -> caution

REWORKABLE EPOXY RESIN AND CURATIVE BLEND FOR LOW THERMAL EXPANSION APPLICATIONS

BACKGROUND

Curable compositions can be used to form cured products for a variety of applications. For example, a curable composition can be used to form an underfill for a ball grid array (BGA) of an electronic assembly. The underfill provides solder balls of the BGA protection from the outside environment and provides structural reinforcement to solder joints of the BGA. Commercially available underfills have a high glass transition temperature ($T_g$) and, as a result of their high $T_g$, such underfills have low reworkability, which makes it difficult (or impossible) to separate a BGA joined to a substrate by such underfills without damaging the substrate and/or the BGA. Electronic assemblies including an underfill having low reworkability are difficult (or impossible) to refurbish or upgrade with new BGAs, thereby increasing the cost of replacing or upgrading such electronic assemblies.

Additionally, commercially available underfills are designed to be formed cured quickly, for ease of mass production, and are prepared from curable compositions that are formulated to have very short cure times (e.g., "snap cures") and to flow quickly to reduce the amount of time it takes for the composition to flow between the BGA and the substrate. For ease of mass production, curable compositions for forming such underfills also have very long potlife and very long worklife (e.g., 24 hours or more). In order to achieve short cure times and long worklife, the aforementioned underfills have high cure temperatures (e.g., recommended cure temperatures on the close order of 150 to 160° C.), which result in permanent cooling stresses after the underfill has cooled. Additionally, to achieve high flowability, the aforementioned underfills often include diluents that raise the coefficient of thermal expansion (CTE) of the underfill. As a result, such underfills have an undesirably high CTE. High CTE and cooling stresses can be problematic for BGAs having a high density of solder balls that are smaller than typical solder balls (e.g., fine pitch BGAs) and for BGAs having a large footprint (e.g., BGAs that cover a large area).

SUMMARY

According to embodiments of the present disclosure, a curable composition includes: an epoxy resin, and amine curing component including: an aromatic amine curing agent, and a solubilizer including an aliphatic amine, a cycloaliphatic amine, a non-volatile primary alcohol, a non-volatile solvent or a mixture thereof. The aromatic amine, the aliphatic and/or cycloaliphatic amine may reduce the $T_g$ of a cured product of the curable composition, thereby increasing the reworkability of the cured product. In some embodiments, the amine curing component includes the non-volatile primary alcohol and non-volatile solvent in a total amount <15 wt %, based on the total amount of the amine curing component.

In some embodiments, the epoxy resin has a low viscosity (e.g., a viscosity at 25° C. of 2000 centipoise (cP) or less) and, as a result, it may be unnecessary for the curable composition to include diluents or other components that raise the CTE of the cured product. Additionally, as a result of the low viscosity of the epoxy resin, the curable composition may include high amounts of a filler, which may further reduce the CTE of the cured product.

According another embodiment of the present disclosure, an electronic assembly includes: a substrate; an underfill including a cured product of the curable composition on the substrate; and a ball grid array on the underfill.

BRIEF DESCRIPTION OF THE DRAWINGS

The accompanying drawings, together with the specification, illustrate embodiments of the present invention, and, together with the description, serve to explain the principles of the present invention.

FIG. 3 is a chart of components of curable compositions relative to corresponding potential effects of the components on a curable composition and/or a cured product of the curable composition.

DETAILED DESCRIPTION

In the following detailed description, only certain embodiments of the present invention are shown and described, by way of illustration. As those skilled in the art would recognize, the invention may be embodied in many different forms and should not be construed as being limited to the embodiments set forth herein. Also, in the context of the present application, when a first element is referred to as being "on" a second element, it can be directly on the second element or be indirectly on the second element with one or more intervening elements interposed therebetween. As used herein, the expression "cured product" refers to a product that results from fully curing a curable composition. Additionally, as used herein, the expression "fully curing" refers to curing the curable composition to a degree of cure such that subsequent exposure of the resultant cured product to temperatures at or above the original cure temperature, with the exception of temperatures high enough to melt or decompose the cured product, will not materially alter the physical properties of the cured product beyond those achieved by completion of the original cure.

Figure 1:
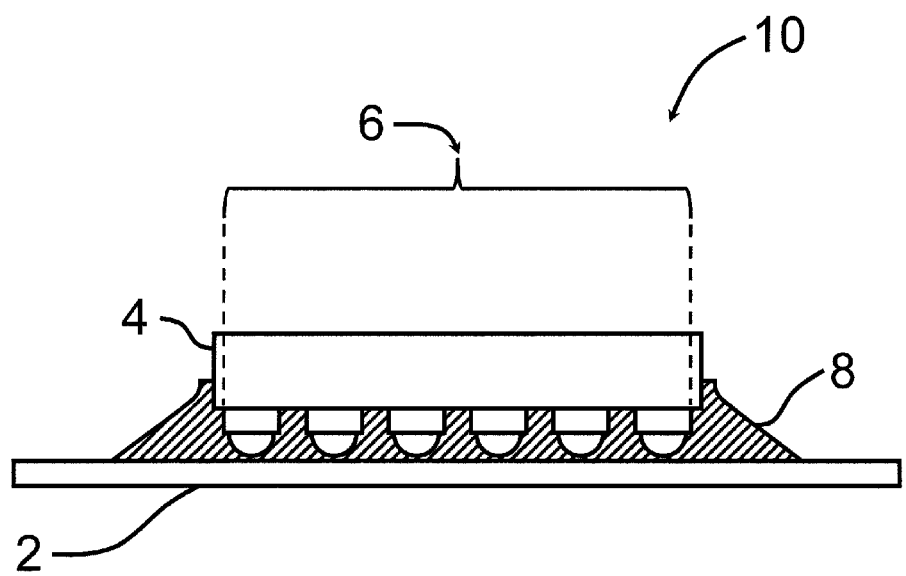
FIG. 1 is a schematic cross-sectional view of a ball grid array device and an underfill including a cured product of a curable composition according to an embodiment of the present disclosure.

A curable composition according to an embodiment of the present invention can be used to form a cured product that can be used as an adhesive such as, for example, a glob top encapsulant, an edge seal for an electronic device, and/or an underfill for a ball grid array (BGA) or a flip chip component of an electronic assembly. For example, FIG. 1 is a cross-sectional view of an electronic device according to an embodiment of the invention. In the embodiment shown in FIG. 1, an electronic assembly 10 includes a die 4 including a BGA 6 on a substrate 2 and the cured product of the curable composition (e.g., an underfill) 8 between the substrate and the die. The substrate 2, die 4 and BGA 6 may include any suitable materials used in existing electronic devices. As used herein, the term "electronic device" refers to an electronic component, such as a BGA, and the term "electronic assembly" refers to electronic device attached to a substrate by soldering and/or with an underfill or adhesive.

According to embodiments of the invention, the cured product of the curable composition has a $T_g$ that is relatively lower than that of other underfills. When the BGA 6 is joined to the substrate 2 by an embodiment of the cured product of the curable composition (e.g., the underfill 8), the relatively lower $T_g$ of the cured product reduces (or minimizes) the amount of damage caused by separating the BGA from the substrate at elevated temperatures. Accordingly, an electronic assembly including an embodiment of the cured product of the curable composition as an underfill has improved reworkability as compared to electronic assemblies including other underfills. As a result of its increased reworkability, an electronic assembly including an embodiment of the cured product can have the BGA removed and replaced, thereby reducing the cost of refurbishing or upgrading the electronic assembly.

In contrast to other underfills, the curable composition according to embodiments of the invention is not specifically designed for mass production use and, therefore, can have a shorter potlife (e.g., ≤8 hours), a shorter worklife (e.g., 4 to 8 hours), a longer cure time (e.g., 1 to 2 hours) at lower cure temperatures (e.g., ≤120° C.), and/or can include a filler (e.g., in an amount from 40 to 70 vol %). As a result, the curable composition according to embodiments of the invention can be formulated to form a cured product having a relatively lower $T_g$ (e.g., 95 to 115° C.) and/or a relatively lower CTE (e.g., ≤55 ppm/° C.) as compared to other underfills. For example, anhydride, imidazole and solid latent curatives provide other curable compositions with long worklife (e.g., >24 hours), but the resultant underfill has a high $T_g$ and is cured at high temperature. In contrast, a curable composition according to embodiments of the invention includes an amine curing component including an aromatic amine and an aliphatic amine and/or a cycloaliphatic amine, each of which can lower the $T_g$ of the resultant cured product and provide the curable composition with a relatively shorter worklife (e.g., ≤8 hours, or 4 to 8 hours) that would be unsuitable for other curable compositions.

A curable composition according to embodiments of the present invention also includes an epoxy resin having a low viscosity (e.g., a viscosity at 25° C. of 2000 centipoise (cP) or less) and a low molecular weight (e.g., a molecular weight of ≤350 grams per equivalent). As a result of the low viscosity of the epoxy resin it may be unnecessary for embodiments of the curable composition to include diluents to further reduce the viscosity of the curable composition. Additionally, as a result of the lower $T_g$ of the aromatic amine and the aliphatic amine and/or the cycloaliphatic amine, it is unnecessary for embodiments of the curable composition to include flexibilizers, and/or to replace a portion of the epoxy resin with an epoxy-functional modifier, such as a mono-glycidyl ether or an aliphatic polyglycidyl ether. Although some diluents, flexibilizers and epoxy-functional modifiers lower the $T_g$ of the resultant cured product, they may also undesirably increase the CTE of the resultant cured product. Thus, by reducing (or minimizing or eliminating) the amount of certain diluents, flexibilizers, and/or epoxy-functional modifiers in embodiments of the curable composition, the CTE of the resultant cured product can be reduced. In the present disclosure, references to the CTE of a material are made with respect to the CTE at a temperature below the Tg of the material.

According to embodiments of the invention, the low viscosity of the epoxy resin also allows the curable composition to include high concentrations of a filler (e.g., a filler having a CTE ≤8 ppm/° C.) by reducing the overall viscosity of the curable composition. When included in embodiments of the curable composition, the filler further reduces the CTE of the resultant cured product, but it increases the viscosity of the curable composition. While a cured product having a low CTE is desirable for low thermal expansion applications (e.g., fine pitch BGAs and/or large footprint BGAs), curable compositions having increased viscosity are more difficult to flow and to form as underfills. Accordingly, the amount of filler, if any, included in embodiments of the curable composition may be balanced in consideration of the viscosity of the curable composition. Additionally, the lower viscosity of some embodiments of the curable composition allows for use of a filler with more effect on viscosity of the filled composition, or for use of an increased amount of filler while retaining a suitable (or useful) viscosity of the curable composition.

For example, referring to the embodiment shown in FIG. 1, the underfill 8 is formed by applying an embodiment of the curable composition at two adjacent edges of the BGA 6 at elevated temperature (to reduce the viscosity and flow of the curable composition). The curable composition is then drawn under the BGA by capillary action, displacing air from under the BGA as the curable composition fills a gap under the BGA. The curable composition is then cured to form a cured product (e.g., the underfill 8) and the solder ball connections of the BGA are encapsulated by the cured product. Accordingly, in some embodiments, the viscosity of the curable composition is adapted to allow the curable composition to flow under a BGA to form an underfill. Although curable compositions for other underfills may be flowed under a BGA in underfill times of 5 seconds (by including little or no filler), to facilitate mass production, embodiments of the curable composition according to the invention may flowed under a BGA in underfill times of 30 to 60 seconds or longer. By having relatively longer underfill times, embodiments of the curable composition can include relatively higher amounts of the filler and further reduce the CTE of the cured product.

Embodiments of the components of the curable composition will now be described in more detail. According to embodiments of the invention, the epoxy resin includes a phenol-based epoxy resin having two or more epoxide groups (e.g., primary epoxide groups), an aniline-based epoxy resin having two or more epoxide groups (e.g., primary epoxide groups), or a mixture thereof. As used herein, the term "phenol-based epoxy resin" refers to a compound including a substituted or unsubstituted phenol group or a substituted or unsubstituted derivative of a phenol group, the term "aniline-based epoxy resin" refers to a compound including a substituted or unsubstituted aniline group or a substituted or unsubstituted derivative of an aniline group, and the term "primary epoxide group" refers to an epoxide group that is bonded to one carbon atom.

According to embodiments of the invention, the amount of the phenol-based epoxy resin and/or the amount of the aniline-based epoxy resin included in the epoxy resin can be used to adjust the $T_g$ of the cured product of the curable composition. For example, when the phenol-based epoxy resin accounts for 100 wt % of the epoxy resin, the cured product of the curable composition may have a $T_g$ of 100° C. In contrast, when the aniline-based epoxy resin accounts for 100 wt % of the epoxy resin, the cured product of the curable composition may have a $T_g$>180° C.

Accordingly, the $T_g$ of the cured product may be adjusted (e.g., a "coarse" adjustment) by controlling the amount of the phenol-based epoxy resin and/or aniline-based epoxy resin included in the epoxy resin. For example, in one embodiment, the epoxy resin includes 100 wt % of the phenol-based epoxy resin and is substantially free of the aniline-based epoxy resin. In other embodiments, a portion or all of the phenol-based epoxy resin is substituted by one or more of the aniline-based epoxy resins to increase the $T_g$ of the cured product without significantly increasing the CTE of the cured product. For example, the epoxy resin and the amine curing component can be combined in a substantially stoichiometric amount and cured for 1 hour at 110° C. Thus, the $T_g$ of the cured product may be adjusted between 100° C. and >180° C. by substituting a portion or all of the phenol-based epoxy resin with the aniline-based epoxy resin.

Additionally, the molecular weight of the epoxy resin may be correlated to the reactivity of the epoxy resin in the curable composition. For example, the molecular weight of the epoxy resin may be inversely proportional to its reactivity (e.g., higher molecular weight epoxy resins may be less reactive and lower molecular weight resins may be more reactive). In addition, the reactivity of the epoxy resin may be correlated to the cure time and cure temperature of the curable composition. For example, less reactive epoxy resins may have longer cure times and/or higher cure temperatures. In some embodiments, the phenol-based or aniline-based epoxy resin has a molecular weight of less than 350 g/mol.

In some embodiments, the cured epoxy resin composition has a $T_g$ from 45 to 65 ppm/° C. Non-limiting examples of the phenol-based epoxy resin include diglycidyl ether of bisphenol F (DGEBF) and diglycidyl ether of resorcinol (DGER). Non-limiting examples of the aniline-based epoxy resin include N,N-diglycidylaniline, and para-glycidyl ether of N,N-diglycidylaniline (i.e., triglycidylaniline or TGAN).

According to embodiments of the invention, the amine curing component includes an aromatic amine curing agent having one or more amine groups (e.g., primary amine groups), and a solubilizer or diluent including an aliphatic amine, a cycloaliphatic amine, a non-volatile primary alcohol, a non-volatile solvent or a mixture thereof. The non-volatile solvent may be any suitable non-volatile solvent that does not react with the other components of the curable composition, for example, N-methylpyrrolidone, but the present invention is not limited thereto. In some embodiments, the amine curing component includes the non-volatile primary alcohol and non-volatile solvent in a total amount <15 wt %, based on the total amount of the amine curing component. Including the aromatic amine curing agent in the curable composition may provide a cured product having a low CTE (e.g., 40 to 55 ppm/° C., or <25 ppm/° C. when a filler is included). In some embodiments the aromatic amine curing agent includes 1 or 2 phenyl or phenylene groups. For example, the aromatic amine curing agent may be an aniline-based amine. Non-limiting examples of the aromatic amine curing agent include meta-, ortho-, and para-phenylenediamine, 4,4'-methylenedianiline, and mixtures thereof. By accommodating shorter pot-life, longer cure times and/or lower cure temperatures, the curable composition according to embodiments of the invention can include an aromatic amine curing agent, an aliphatic amine and/or a cycloaliphatic amine.

In some embodiments, the amine curing component includes the aromatic amine curing agent in an amount from 65 to 90 wt %, based on the total weight of the amine curing component. The amine curing component may further include the solubilizer (or diluent) in an amount from 10 to 35 wt %, based on the total weight of the amine curing component. In some embodiments, the aromatic amine curing agent is a crystalline solid at compounding temperatures (e.g., from 20 to 50° C.) and including the solubilizer in the amine curing component solubilizes the aromatic amine curing agent to render the amine curing component a liquid solution at the compounding temperatures (e.g., at 25° C.). The solubilizer may also increase the reactivity of the amine curing component to increase the rate of cure of the curable composition.

In some embodiments, the solubilizer also reduces the $T_g$ of the cured product and provides a cured product having a $T_g$ from 95 to 125° C. (e.g., 95 to 115° C.). For example, when the solubilizer includes the aliphatic amine, the cured product can have a $T_g$ of 105° C. without undesirably increasing the CTE of the cured product. When the solubilizer includes the cycloaliphatic amine the cured product can have a $T_g$ up to 125° C. without undesirably increasing the CTE of the cured product. When the solubilizer includes the non-volatile primary alcohol, the cured product can have a $T_g$<100° C. without undesirably increasing the CTE of the cured product. Accordingly, the curing characteristics of the curable composition and the $T_g$ of the cured product can be adjusted (e.g., a "fine" adjustment) by adjusting the composition and amount of the solubilizer.

The aliphatic amine and cycloaliphatic amine can each have a hydrogen equivalent weight of 55 grams per equivalent or less. As used herein, the expression "hydrogen equivalent weight" refers to the molecular weight of a compound divided by the number of active hydrogen atoms in each molecule of the compound. As the hydrogen equivalent weight of the aliphatic amine and/or the cycloaliphatic amine increases, greater amounts of the aliphatic amine and/or the cycloaliphatic amine can be included in the curable composition. Because the aliphatic amine and/or the cycloaliphatic amine can also act as a diluent, increasing the amount of the aliphatic amine and/or the cycloaliphatic amine in the curable composition increases the dilution of the curable composition, thereby lowering the viscosity of the curable composition and allowing more low expansion filler to be added to the curable composition.

The aliphatic amine and the cycloaliphatic amine can each have 1 or more amine groups (e.g., primary amine groups). The aliphatic amine and the cycloaliphatic amine can each have a molecular weight <250 g/mol. Non-limiting examples of the aliphatic amine and the cycloaliphatic amine include those that are liquids at room temperature (e.g., 25° C.), such as diethylenetriamine, triethylenetetramine, aminoethylpiperazine, para-bis(aminocyclohexyl) methane, and mixtures thereof. Non-limiting examples of the non-volatile primary alcohol include benzyl alcohol, 2-methyl benzyl alcohol, and mixtures thereof.

In some embodiments, the curable composition includes the above-described filler. For example, the filler may include generally spherical or generally spheroidal particles including inert, mineral or ceramic material having a CTE of 8 ppm/° C. or less. In some embodiments, the filler includes quartz, aluminum oxide (e.g., alumina), sodium glass (e.g., A-glass, alkali-lime glass free or substantially free of boron oxide), borosilicate glass (e.g., E-glass, alumino-borosilicate glass including less than 1% w/w alkali oxides), or mixtures thereof.

The filler can be used to lower the CTE of a cured product of the curable composition. For example, the filler can reduce the CTE of the cured product by 100 to 500% as compared to underfills that do not include the filler. In some embodiments, the filler is added to the curable composition in amounts suitable for matching the CTE of the cured product (or an underfill including the cured product) to the CTE of solder balls (or solder joints), pads and/or printed wire boards (PWBs) of an electronic assembly. For example, solder joints may have a CTE of 25 ppm/° C. and PWBs may have a CTE of 15 ppm/° C. The curable composition can be formulated to include the filler to provide a cured product having a lower CTE without substantially impairing the properties of the cured product (e.g., by maintaining suitable reworkability of the cured product). For example, the curable composition may include the filler in an amount sufficient to produce a cured product having a CTE from of less than or equal to 25 ppm/° C. (e.g., 16 to 25 ppm/° C.). When the curable composition does not include the filler, the resultant cured product may have a coefficient of thermal expansion from 40 to 55 ppm/° C.

The curable composition may include the filler in an amount from 40 to 70 vol %, based on the total volume of the composition. For example, the curable composition may include 60 vol % of the filler and 40 vol % of the epoxy resin and the amine curing component, based on the total volume of the curable composition. In some embodiments, the filler is present in the curable composition in an amount of 50 vol % or more, based on the total volume of the curable composition. By using Milewski packing techniques, the filler can be included in the curable composition in amounts greater than 60 vol %, without impairing the ability of the curable composition to form an underfill of a BGA. Generally spherical and/or generally spheroidal particles pack more efficiently than particles having other shapes. More efficient packing of the filler allows for greater amounts of the filler to be included in the curable composition.

Depending upon the CTE of the cured product without the filler, the CTE of the cured product can be reduced by adding the filler to the curable composition in accordance with the Rule of Mixtures according to Equation 1 below. For example, if the CTE of the cured product without the filler is 50 ppm/° C., according to the Rule of Mixtures, adding 60 vol % of a filler having a CTE 8 ppm/° C. filler (e.g., a fine/small mixture of alumina particles) to curable composition will result in the cured product having a net CTE= (40%×50 ppm/° C.)+(60%×8 ppm/° C.)=20 ppm/° C.+4.8 ppm/° C.=24.8 ppm/° C. When the loading of filler is 50 vol % or greater and the curable composition includes a coupling agent, such as an epoxy- or amine-terminated methoxy- or ethoxy-silane, the net CTE is substantially lower than can be accounted for by the Rule of Mixtures.

Figure 2:
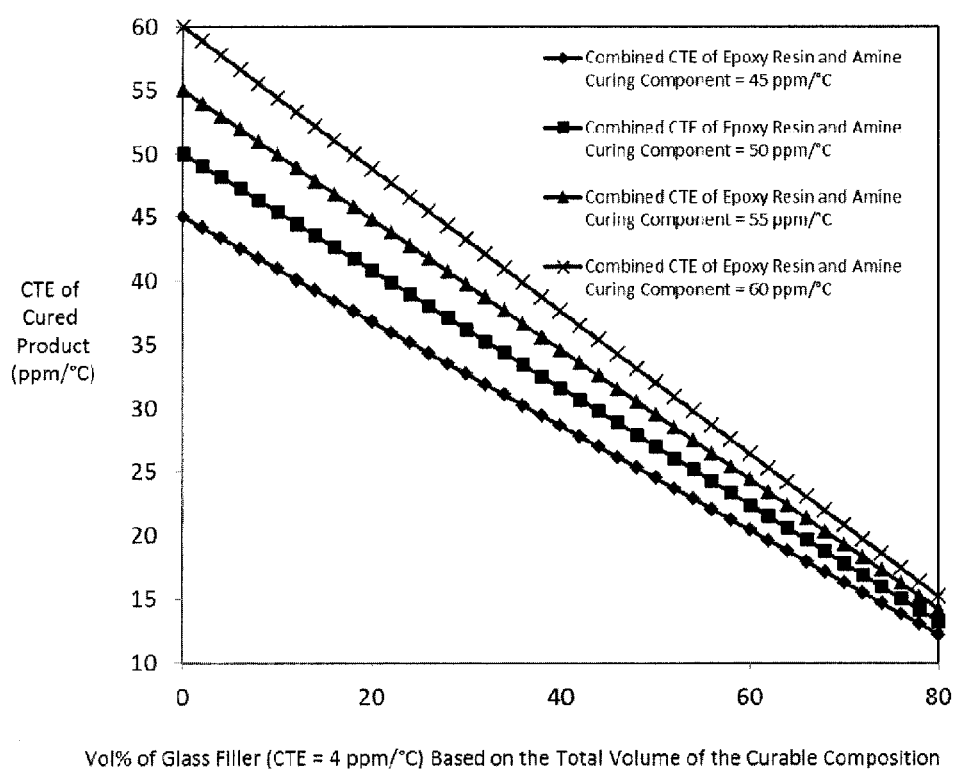
FIG. 2 is a graph of coefficients of thermal expansion calculated for prophetic (or predicted) cured products of prophetic curable compositions relative to volume % of glass filler in the prophetic (or predicted) curable compositions.

Net CTE=(Vol % of epoxy resin and amine curing component×CTE of)+(Vol % of filler×CTE of filler)    Equation 1:

FIG. 2 is a graph showing CTEs calculated using the Rule of Mixtures according to Equation 1 for prophetic (or predicted) cured products with respect to the amount of filler (e.g., E-glass having a CTE of 4 ppm/° C.) included in the respective prophetic (or predicted) curable compositions. In FIG. 2, when the curable compositions do not include any filler, the curable compositions form cured products having respective CTEs of 45 ppm/° C., 50 ppm/° C., 55 ppm/° C. and 60 ppm/° C.

The particles of the filler may include first particles (e.g., primary particles) and second particles (e.g., secondary particles), an average particle diameter of the first particles being larger (e.g., 5 to 10 times larger) than an average particle diameter of the second particles. For example, the first particles may have a first particle size distribution closely distributed about a first median particle diameter from 20 to 40 μm (e.g., ≥75% of the first particles may have a first particle diameter that is equal to the first median particle diameter ±33% or less). In some embodiments, ≥75% the first particles have a first particle diameter of 25 to 45 μm. The second particles may have a second particle size distribution closely distributed about a second median particle diameter from 1/5 to 1/10 of the first median particle diameter of the first particles (e.g., ≥75% of the second particles may have a second particle diameter that is equal to the second median particle diameter ±33% or less). In some embodiments, ≥75% of the second particles have a second particle diameter of 2 to 6 μm. When the particles include first particles and second particles, the relatively smaller second particles may be located (or distributed) between the first particles. A suitable ratio of the first particles to the second particles may vary based on the relative sizes of the first and second particles and a proximity of the respective size distributions of the first and second particles to one another. For example, in an embodiment where each of the first particles has a diameter that is 10 times a diameter of each of the second particles, a suitable ratio of the first particles to the second particles may be 1:1 to 4:1 (e.g., 2:1 to 4:1, or 3:1) by volume.

The filler may also increase the thermal conductivity (k) of the cured product. In some embodiments, the filler increases the thermal conductivity of the cured product by 100 to 700% (e.g., 100 to 500%), as compared to a cured product that does not include the filler. For example, other underfills that do not include a filler will have a thermal conductivity of <0.25 W/(m·K), while embodiments of the cured product that include alumina, which has a thermal conductivity that is as much as 80 times that of glass or quartz, can have a thermal conductivity of the cured product as high as 2.5 W/(m·K) or more. Generally spherical or generally spheroidal alumina particles can be included in the curable composition in amounts as high as 70 vol % without impairing the flowability of the curable composition (e.g., flowability suitable for forming an underfill). For example, the curable composition may include generally spherical or generally spheroidal alumina, or mixtures of generally spherical or generally spheroidal alumina and other filler particles (e.g., glass and/or quartz), in amounts from 75 to 95 wt %, based on the total weight of the curable composition. While tabular alumina also increases the thermal conductivity of the resultant cured product, tabular alumina increases the viscosity of the curable composition and can make it difficult for the curable composition to flow to form an underfill.

Non-limiting examples of the filler include Hacthane 308 and Isotherm HK-91 (each of which is manufactured by Raytheon Co., El Segundo, Calif.). In some embodiments, the cured product has a thermal conductivity of greater than or equal to 1.0 W/(m·K). Although the alumina included in Hacthane 308 and Isotherm HK-91 may not be optimized for Milewski packing, a curable composition including 75 wt % (45 vol %) of spherical alumina, such as Hacthane 308, may provide a cured product having a thermal conductivity of 1.0 W/(m·K) and a curable composition including >88 wt % (>65 vol %) of spherical alumina, such as Isotherm HK-91, can provide a cured product having a thermal conductivity of 2.65 W/(m·K).

FIG. 3 is a chart graphically illustrating the potential effects of the above-described components of the curable composition on the curable composition and/or the resultant cured product. In FIG. 3, the arrows indicate that the respective component of the curable composition increases or decreases the identified characteristic and has potentially desirable or potentially undesirable effect on the curable composition and/or the resultant cured product. In addition to the components described above, embodiments of the curable composition can also include additional components, such as pigments (e.g., mineral pigments) and/or coupling agents. The above-described aspects of the present disclosure are further illustrated by the following examples.

EXAMPLE 1

A mixture was formed by combining 110 parts by weight (pbw) of an epoxy resin (i.e., diglycidyl ether of resorcinol), 21 pbw of m-phenylenediamine (MPDA), 7 pbw of aminoethylpiperazine (AEP), 855 pbw (64 vol % of the total volume of the mixture) of alumina including first particles having a first median particle size of 40 μm and second particles having a second median particle size of 4 μm 5.0 pbw of mineral pigment (i.e., red iron oxide or $Fe_3O_4$), and 2.0 pbw of a coupling agent (i.e., gamma-glycidoxypropyltrimethoxysilane). The alumina, epoxy resin, mineral pigment and coupling agent were mixed at 85° C. under vacuum in a planetary mixer. After achieving a smooth consistency, the temperature was reduced to 40° C. while mixing was continued to form an epoxy mixture. The MPDA was dissolved in the AEP at 65° C. and then cooled to 25° C. to form an amine mixture. The amine mixture was then added to the epoxy mixture and mixed under vacuum while the temperature was reduced to 25° C. to form a mixture (a curable composition). The resultant mixture was then transferred to plastic cartridges and frozen at −80° C. for later use. A sample of the resultant mixture was cured for 1 hour at a temperature of 110° C. The resultant cured product exhibited a $T_g$ of 105° C. At temperatures below the $T_g$ (e.g., temperatures <80° C.) the cured product exhibited a CTE of 15 ppm/° C. At temperatures above the $T_g$ (e.g., temperatures >120° C.) the cured product exhibited a CTE of 62 ppm/° C. The cured product exhibited a thermal conductivity of ≥2.4 W/(m·K). The cured product exhibited no changes in its physical properties when subsequently exposed to a temperature of 180° C.

EXAMPLE 2

A mixture was formed by combining 191 pbw of an epoxy resin (i.e., diglycidyl ether of resorcinol), 31 pbw of MPDA, 11 pbw of triethylenetetramine (TETA), 570 pbw (44.2 vol % based on the total volume of the mixture) of first particles including E-glass and having a first median particle size of 35 μm as filler, 190 pbw (15.3 vol % based on the total volume of the mixture) of second particles including A-glass and having a second median particle size of 7 μm, 3 pbw of mineral pigment (i.e., Ferro V9440 yellow), and 2 pbw of a coupling agent (i.e., gamma-glycidoxypropyltrimethoxysilane). The first and second particles, epoxy resin, mineral pigment, and coupling agent were combined and then mixed at 85° C. under vacuum in a planetary mixer. After achieving a smooth consistency, the temperature was reduced to 40° C. while mixing was continued to form an epoxy mixture. The MPDA was dissolved in the TETA at 65° C. and then cooled to form an amine mixture. The amine mixture was then added to the epoxy mixture and mixed under vacuum while the temperature was reduced to 25° C. to form a mixture (a curable composition). The resultant mixture was then transferred to plastic cartridges and frozen at −80° C. for later use. A sample of the resultant mixture was cured for 1 hour at a temperature of 110° C. The resultant cured product exhibited a $T_g$ of 102° C. At temperatures below the $T_g$ (e.g., temperatures <80° C.) the cured product exhibited a CTE of 20 ppm/° C. At temperatures above the $T_g$ (e.g., temperatures >120° C.) the cured product exhibited a CTE of 72 ppm/° C. The cured product exhibited no changes in its physical properties when subsequently exposed to a temperature of 180° C.

According to embodiments of the invention, a cured product of a curable composition has a $T_g$ in a range from 95 to 115° C. (e.g., a $T_g$ of 100° C.). An underfill including a cured product having a $T_g$ in the foregoing range will have suitable reworkability. It will cure fully in not more than 2 hours (e.g., 60±5 minutes) at a temperature of not more than 120° C. (e.g., less than or equal to 115° C.). For example, the curable composition may be fully cured in a cure time of 1 to 2 hours (e.g., 1 hour) at a cure temperature from 100 to 110° C.

While the present invention has been described in connection with certain embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A curable composition comprising:
   an epoxy resin;
   an amine curing component; and
   a filler comprising particles having a generally spherical or generally spheroidal shape and having a coefficient of thermal expansion of 8 ppm/° C. or less at a temperature below the $T_g$ of the filler,
   wherein the amine curing component comprises from 65 to 90 wt % of an aromatic amine curing agent and from 10 to 35 wt % of a solubilizer, based on the total weight of the amine curing component;
   wherein the solubilizer comprises an aliphatic amine, a cycloaliphatic amine, a non-volatile primary alcohol, a non-volatile solvent or a mixture thereof;
   wherein the filler is present in an amount of from 40 to 70 vol % based on the total volume of the curable composition; and
   wherein a cured product of the curable composition has a $T_g$ of 95 to 125° C. and a coefficient of thermal expansion of less than or equal to 25 ppm/° C. at a temperature below the $T_g$ of the cured product.

2. The curable composition of claim 1, wherein the epoxy resin comprises a phenol-based epoxy resin having two or more epoxide groups, an aniline-based epoxy resin having two or more epoxide groups, or a mixture thereof.

3. The curable composition of claim 1, wherein the epoxy resin comprises a diglycidyl ether of Bisphenol F, a diglycidyl ether of resorcinol, an N,N-diglycidyl aniline, a para-glycidyl ether of N,N-diglycidylaniline, or a mixture thereof.

4. The curable composition of claim 1, wherein the epoxy resin has a molecular weight of less than 350 g/mol.

5. The curable composition of claim 1, wherein the epoxy resin has a viscosity at 25° C. of 2000 centipoise (cP) or less.

6. The curable composition of claim 1, wherein the amine curing component is a liquid at 25° C.

7. The curable composition of claim 1, wherein the aliphatic amine or the cycloaliphatic amine has a hydrogen equivalent weight of 55 grams per equivalent or less.

8. The curable composition of claim 1, wherein the aliphatic or cycloaliphatic amine comprises diethylenetriamine, triethylenetetramine, aminoethylpiperazine, para-bis (aminocyclohexyl) methane, or a mixture thereof.

9. The curable composition of claim 1, wherein the aromatic amine curing agent comprises one or more primary amine groups.

10. The curable composition of claim 1, wherein the non-volatile primary alcohol comprises benzyl alcohol, 2-methylbenzyl alcohol, 4-methylbenzyl alcohol, or a mixture thereof, and the non-volatile solvent comprises N-methylpyrrolidone.

11. A curable composition comprising:
an epoxy resin;
an amine curing component; and
a filler comprising particles having a generally spherical or generally spheroidal shape and having a coefficient of thermal expansion of 8 ppm/° C. or less at a temperature below the $T_g$ of the filler;
wherein the amine curing component comprises from 65 to 90 wt % of an aromatic amine curing agent and from 10 to 35 wt % of a solubilizer, based on the total weight of the amine curing component;
wherein the solubilizer comprises an aliphatic amine, a cycloaliphatic amine, a non-volatile primary alcohol, a non-volatile solvent or a mixture thereof; and
wherein a cured product of the curable composition has a $T_g$ of 95 to 125° C.

12. The curable composition of claim 11, wherein the filler comprises quartz, aluminum oxide, sodium glass, borosilicate glass, or mixtures thereof.

13. The curable composition of claim 11, wherein the particles comprise first particles having a first particle size distribution and second particles having a second particle size distribution, wherein ≥75 wt % of particles in the first particle size distribution have a particle diameter of 25 to 45 μm, and ≥75 wt % of particles in the second particle size distribution have a particle diameter of 2 to 6 μm.

14. The curable composition of claim 13, wherein a ratio of the first particles to the second particles is 2:1 to 4:1 by volume.

15. The curable composition of claim 11, wherein the filler is present in an amount of from 40 to 70 vol % based on the total volume of the curable composition.

16. An electronic assembly comprising:
a substrate;
an underfill comprising a cured product of a curable composition on the substrate; and
a ball grid array on the underfill;
wherein the curable composition comprises:
an epoxy resin; and
an amine curing component;
wherein the amine curing component comprises from 65 to 90 wt % of an aromatic amine curing agent and from 10 to 35 wt % of a solubilizer, based on the total weight of the amine curing component;
wherein the solubilizer comprises an aliphatic amine, a cycloaliphatic amine, a non-volatile primary alcohol, a non-volatile solvent or a mixture thereof; and
wherein the cured product has a $T_g$ of 95 to 125° C.

17. The electronic assembly of claim 16, wherein the cured product has a $T_g$ from 95 to 115° C.

18. The electronic assembly of claim 16, wherein the cured product has a coefficient of thermal expansion from 40 to 55 ppm/° C. at a temperature below the $T_g$ of the cured product.

19. The electronic assembly of claim 16, wherein the curable composition further comprises a filler comprising particles having a generally spherical or generally spheroidal shape and having a coefficient of thermal expansion of 8 ppm/° C. or less at a temperature below the $T_g$ of the filler;
wherein the filler is present in an amount of from 40 to 70 vol % based on the total volume of the curable composition; and
wherein the cured product has a coefficient of thermal expansion of less than or equal to 25 ppm/° C. at a temperature below the $T_g$ of the cured product.

* * * * *